United States Patent [19]

Peters

[11] Patent Number: 5,920,490
[45] Date of Patent: Jul. 6, 1999

[54] INTEGRATED CIRCUIT TEST STIMULUS VERIFICATION AND VECTOR EXTRACTION SYSTEM

[75] Inventor: Michael J. Peters, Fort Collins, Colo.

[73] Assignee: Adaptec, Inc., Milpitas, Calif.

[21] Appl. No.: 08/773,386

[22] Filed: Dec. 26, 1996

[51] Int. Cl.[6] .................................................. G06F 17/50
[52] U.S. Cl. ........................................... 364/578; 714/744
[58] Field of Search ............................ 395/500; 364/488, 364/490, 578; 714/744

[56] References Cited

U.S. PATENT DOCUMENTS

| | | | |
|---|---|---|---|
| 4,775,950 | 10/1988 | Terada et al. ............................. | 364/578 |
| 4,860,291 | 8/1989 | Damm et al. .............................. | 371/27 |
| 5,051,938 | 9/1991 | Hyduke .................................... | 364/578 |
| 5,126,966 | 6/1992 | Hafeman et al. ......................... | 364/500 |
| 5,278,769 | 1/1994 | Bair et al. ................................. | 364/490 |
| 5,373,514 | 12/1994 | Ma ......................................... | 371/57.1 |
| 5,426,770 | 6/1995 | Nuber ...................................... | 395/500 |
| 5,446,742 | 8/1995 | Vahabi et al. ............................. | 371/27 |
| 5,574,893 | 11/1996 | Southgate et al. ....................... | 395/500 |

OTHER PUBLICATIONS

K. P. Parker "Integrating Design and Test: Using CAE Tools For ATE Programming," Computer Society Press of the IEEE.

*Primary Examiner*—Vincent N. Trans
*Assistant Examiner*—Hugh Jones
*Attorney, Agent, or Firm*—Duft, Graziano & Forest, P.C.

[57] ABSTRACT

A logic simulation monitoring system to verify a test stimulus set and generate a test vector set for use on an Automatic Test Equipment (ATE) device during manufacturing tests. The simulation monitor executes unobtrusively as part of the logic simulation to monitor the logic simulation's real time signal activity including contention checks, output strobe margins, and ATE compatibility checks, in addition to extracting the appropriate signal response or vector resulting from a given stimulus. The simulation monitor comprises at least one simulation monitor code block generated from a combination of values from an integrated circuit parameter file and at least one code block template. Output from the simulation monitor includes a report of the contention errors and input signal errors, and a test vector set comprised of the input test stimulus set used with the logic simulation and the stimulus responses resulting from the logic simulation all in an ATE compatible and ready to use format.

4 Claims, 9 Drawing Sheets

FIG 4A

```
411  %device   = x28c512         // Xicor 64K x 8 EEPROM
412  %partnum  = x28c512-15      // Part number
413  %version  = _15             // 150ns access time version
414  %test     = short
415  %pins     = 32              // package pin count
416  %period   = 500ns           // tester period size
417  %margin   = 2ns             // output strobe margin /*   431   432          433    434         435  436  437  438  439  440    441    442    443
     Pin   Signal       Pin    Cell             In   In   Out  Out  Out    Allow  Input  Output
     Num   Name         Type   Type        Fmt  Stt  Stp  Stt  Stp  Type   Contn  Enable Enable
 ----------------------------------------------------------------------------------------------
*/
451   1   NC            NC
452   2   NC            NC
454   3   tb.u1.A15     INPUT  iokz32f     SBC  50   450
      4   tb.u1.A12     INPUT  iokz32f     SBC  50   450
      5   tb.u1.A7      INPUT  iokz32f     SBC  50   450
      6   tb.u1.A6      INPUT  iokz32f     SBC  50   450
      7   tb.u1.A5      INPUT  iokz32f     SBC  50   450
      8   tb.u1.A4      INPUT  iokz32f     SBC  50   450
      9   tb.u1.A3      INPUT  iokz32f     SBC  50   450
     10   tb.u1.A2      INPUT  iokz32f     SBC  50   450
     11   tb.u1.A1      INPUT  iokz32f     SBC  50   450
     12   tb.u1.A0      INPUT  iokz32f     SBC  50   450
```

```
13  tb.u1.D0   INOUT  iokz32f  NRZ  0    0    0    350  350  S3  FALSE  tb.rIE_  tb.u1.rOE
14  tb.u1.D1   INOUT  iokz32f  NRZ  0    0    0    350  350  S3  FALSE  tb.rIE_  tb.u1.rOE
15  tb.u1.D2   INOUT  iokz32f  NRZ  0    0    0    350  350  S3  FALSE  tb.rIE_  tb.u1.rOE
16  VSS        GROUND
17  tb.u1.D3   INOUT  iokz32f  NRZ  0    0    0    350  350  S3  FALSE  tb.rIE_  tb.u1.rOE
18  tb.u1.D4   INOUT  iokz32f  NRZ  0    0    0    350  350  S3  FALSE  tb.rIE_  tb.u1.rOE
19  tb.u1.D5   INOUT  iokz32f  NRZ  0    0    0    350  350  S3  FALSE  tb.rIE_  tb.u1.rOE
20  tb.u1.D6   INOUT  iokz32f  NRZ  0    0    0    350  350  S3  FALSE  tb.rIE_  tb.u1.rOE
21  tb.u1.D7   INOUT  iokz32f  NRZ  0    0    0    350  350  S3  FALSE  tb.rIE_  tb.u1.rOE
22  tb.u1.CE_  INPUT  iokz32f  RO   100  400
23  tb.u1.A10  INPUT  iokz32f  SBC  50   450
24  tb.u1.OE_  INPUT  iokz32f  RO   100  400
25  tb.u1.A11  INPUT  iokz32f  SBC  50   450
26  tb.u1.A9   INPUT  iokz32f  SBC  50   450
27  tb.u1.A8   INPUT  iokz32f  SBC  50   450
28  tb.u1.A13  INPUT  iokz32f  SBC  50   450
29  tb.u1.A14  INPUT  iokz32f  SBC  50   450
30  NC         NC
31  tb.u1.WE_  INPUT  iokz32f  RO   100  400  PU  100
32  VDD        POWER
```

```
511                                  512
always @([SIGNAL NAME]) begin : [BLOCK NAME]
       513
  if ([INPUT ENABLE]) begin
                              514
    if ($time && ($time % iPeriod != [INPUT START TIME])) begin $display("Error(%0t) : %m - illegal input transition on NRZ signal [SIGNAL NAME]", $time);

iTErrors = iTErrors + 1;                              515 end              516           517 if ($time && ([SIGNAL NAME] !== 1'b0 | [SIGNAL NAME] !== 1'b1)) begin
              518          519
      iState[[PIN NUM]] = [SIGNAL NAME];

iDirection[[PIN NUM]] = `ATMG_INPUT;
    end           520
  end
end
```

550

```
551                  552
always @(tb.u1.D0) begin : D0_nrz
       553
  if (~tb.rIE_) begin
                    554
    if ($time && ($time % iPeriod != 0)) begin            555

$display("Error(%0t) : %m - illegal input transition on NRZ signal tb.u1.D0", $time);

iTErrors = iTErrors + 1;

end           556           557 if ($time && (tb.u1.D0 !== 1'b0 | tb.u1.D0 !== 1'b1)) begin
                        559
      iState[13] = tb.u1.D0;
558
      iDirection[13] = `ATMG_INPUT;

end         560
  end
end
```

FIG. 7

```
Error(110)   : log - illegal input transition on NRZ signal    tb.ul.A15  ⎫
Error(110)   : log - illegal input transition on NRZ signal    tb.ul.A10  ⎪
Error(110)   : log - illegal input transition on NRZ signal    tb.ul.A5   ⎬ 710
Error(110)   : log - illegal input transition on NRZ signal    tb.ul.A1   ⎪
Error(110)   : log - illegal input transition on NRZ signal    tb.ul.A0   ⎭
Error(8400)  : log - same level contention on signal           tb.ul.D6   ⎫
Error(8400)  : log - same level contention on signal           tb.ul.D5   ⎬ 720
Error(8400)  : log - same level contention on signal           tb.ul.D4   ⎪
Error(8400)  : log - same level contention on signal           tb.ul.D0   ⎭
Error(8400)  : log - illegal input transition on NRZ signal    tb.ul.D6   ⎫
Error(8400)  : log - illegal input transition on NRZ signal    tb.ul.D5   ⎬ 730
Error(8400)  : log - illegal input transition on NRZ signal    tb.ul.D4   ⎪
Error(8400)  : log - illegal input transition on NRZ signal    tb.ul.D0   ⎭
Error(8470)  : log - different level contention on signal      tb.ul.D7   ⎫
Error(8470)  : log - different level contention on signal      tb.ul.D3   ⎬ 740
Error(8470)  : log - different level contention on signal      tb.ul.D2   ⎪
Error(8470)  : log - different level contention on signal      tb.ul.D1   ⎭
Error(8550)  : log - illegal input transition on NRZ signal    tb.ul.D7   ⎫
Error(8550)  : log - illegal input transition on NRZ signal    tb.ul.D3   ⎬ 750
Error(8550)  : log - illegal input transition on NRZ signal    tb.ul.D2   ⎪
Error(8550)  : log - illegal input transition on NRZ signal    tb.ul.D1   ⎭

1432 State changes on observable nets in 1.86 seconds.
769 Events/second.

Simulation stopped at the end of time 10000.0ns.

Ready:
```

INTEGRATED CIRCUIT TEST STIMULUS VERIFICATION AND VECTOR EXTRACTION SYSTEM

FIELD OF THE INVENTION

This invention relates to the field of integrated circuit development and in particular to a system for verifying a test stimulus set for an integrated circuit manufacturing test by refining the test stimulus set during a real time logic simulation of the integrated circuit design, including extracting stimulus and response information and generating a set of test vectors in an ATE required format.

PROBLEM

The typical design and manufacturing cycle for an integrated circuit includes, but is not limited to, executing a logic simulation of the proposed circuit for design verification during the integrated circuit design phase, and executing an automated functional test for manufacturing verification during the integrated circuit manufacturing phase. A logic simulation is a computer program model of an integrated circuit that is designed to function in a manner consistent with the integrated circuit design when a predefined set of stimulus is applied. The predefined stimulus is also known as a vector or pattern set. Logic simulator programs are widely used in the integrated circuit design field by design engineers and are commercially available from any one of several integrated circuit design tool vendors in the industry. Existing logic simulator tools typically run on a Personal Computer or other computer that meets a predefined minimum operating requirement. One reason that running a logic simulation of an integrated circuit design is a valuable step in the integrated circuit design process is that errors in an integrated circuit design can be discovered early in the design process when the errors are more easily corrected with less economic expense prior to building hardware prototypes and/or mass producing the integrated circuit. Another reason that running a logic simulation of an integrated circuit design is a valuable step in the integrated circuit design process is that an integrated circuit design can be under development by a first design engineer at the same time a second design engineer uses the integrated circuit model to simulate its behavior along with other components in a circuit board. Changes in the integrated circuit and/or the circuit board can be rapidly implemented and verified simultaneously using logic simulations without the existence prototype components.

An automated functional test is a process of applying a test stimulus set to a hardware embodiment of an integrated circuit and observing the response to the test stimulus. An evaluation of the functional test results reveal whether the integrated circuit is operating within acceptable parameters or not, and why. Thus, manufacturing engineers can identify if there is a manufacturing process problem or a materials or sub-component failure in the integrated circuit. Automated functional tests are traditionally designed by manufacturing engineers to run on Automatic Test Equipment (ATE) devices that are widely used in the integrated circuit manufacturing field and are commercially available from any one of several integrated circuit manufacturing test tool vendors in the industry. One reason that ATE manufacturing tests are a valuable step in the integrated circuit manufacturing process is because mass produced integrated circuits can be rapidly verified as being operational or not with minimal human intervention.

One problem, however, is that existing integrated circuit design and manufacturing processes result in a design engineer creating a test stimulus set that is compatible with the logic simulator used during the design verification process while a manufacturing engineer separately creates a test stimulus and response set called a test vector set that is compatible with the ATE that is being planned for testing use during the manufacturing verification process. This overlapping effort extends the overall integrated circuit development cycle and increases the dollar cost of developing an integrated circuit in an increasingly competitive field that demands shorter and more cost effective product development cycles. Further complicating the process is that logic simulators are more flexible and support arbitrary stimulus waveforms beyond what the more restrictive ATE's can handle. The result is that the stimulus set created for the logic simulation is operationally incompatible for use with an ATE without significant modification and/or translation. Therefore, translating a test stimulus set that is designed for use with a logic simulator, into a test vector set for use with an ATE, is a difficult and complex manual task.

One existing solution to simplifying the process of creating a test vector set for use with an ATE is to create a test stimulus set that takes into account the integrated circuit design, the logic simulator capabilities, and the ATE capabilities, and then manually debug the test stimulus set and manually extract test vectors by way of post-processing analysis. Debugging the test stimulus set can then proceed by way of post-process analysis of the logic simulation output to identify and separate input stimulus errors from logic errors and extract stimulus responses. However, the process of analyzing logic simulation output is highly labor intensive and increasingly difficult given the complexity of present day multi-layered very large scale integrated circuits. The output of a logic simulation can easily contain from hundreds to millions of lines of information that do not identify logic errors or input stimulus errors. One reason for this difficulty is that logic simulators are designed to assist in debugging integrated circuit logic not input stimulus sets. Thus, the process of verifying a test stimulus set and extracting stimulus responses for use by an ATE is an inexact process that requires long manual hours of post-processing logic simulation results.

For the above reasons, existing techniques for generating a test vector set for use by an ATE are undesirable because they are too expensive, time consuming, and inexact for even modestly complex integrated circuits. Therefore, a need exists for a single automated system that can analyze logic simulation activity in real time for the purpose of generating a test vector set for use by an ATE, in a manner that is highly automated, eliminates the need for post-processing analysis, and requires a minimum of human involvement. A system of this type has heretofore not been realized prior to the present disclosure below.

SOLUTION

The test stimulus verification and vector extraction system of the present invention generates a simulation monitor and unobtrusively executes the simulation monitor with a logic simulation to monitor the logic simulation's real time signal activity, extract stimulus responses, and perform a real-time analysis on the logic simulation signal activity including performing input stimulus and I/O switching tester compatibility checks, contention checks, and verifying output strobe margins. The simulation monitor comprises at least one simulation monitor code block generated from values provided by an integrated circuit parameter file and substantive programming language instructions from at least one code block template. Output from the simulation monitor includes a report of the contention checks, output strobe margins, general signal timing, and stimulus and response analysis. In a preferred embodiment, the individual simulation monitor code blocks of the simulation monitor are compiled into the logic simulator and executed as part of the logic simulation.

BRIEF DESCRIPTION OF THE DRAWINGS

FIGS. 4A and 4B illustrate an example of an integrated circuit parameter file;

FIG. 5 illustrates an example of a code block template and a simulation monitor code block in programming language instruction form;

FIG. 7 illustrates an example of simulation monitor output in output file form.

DETAILED DESCRIPTION

Figure 1:
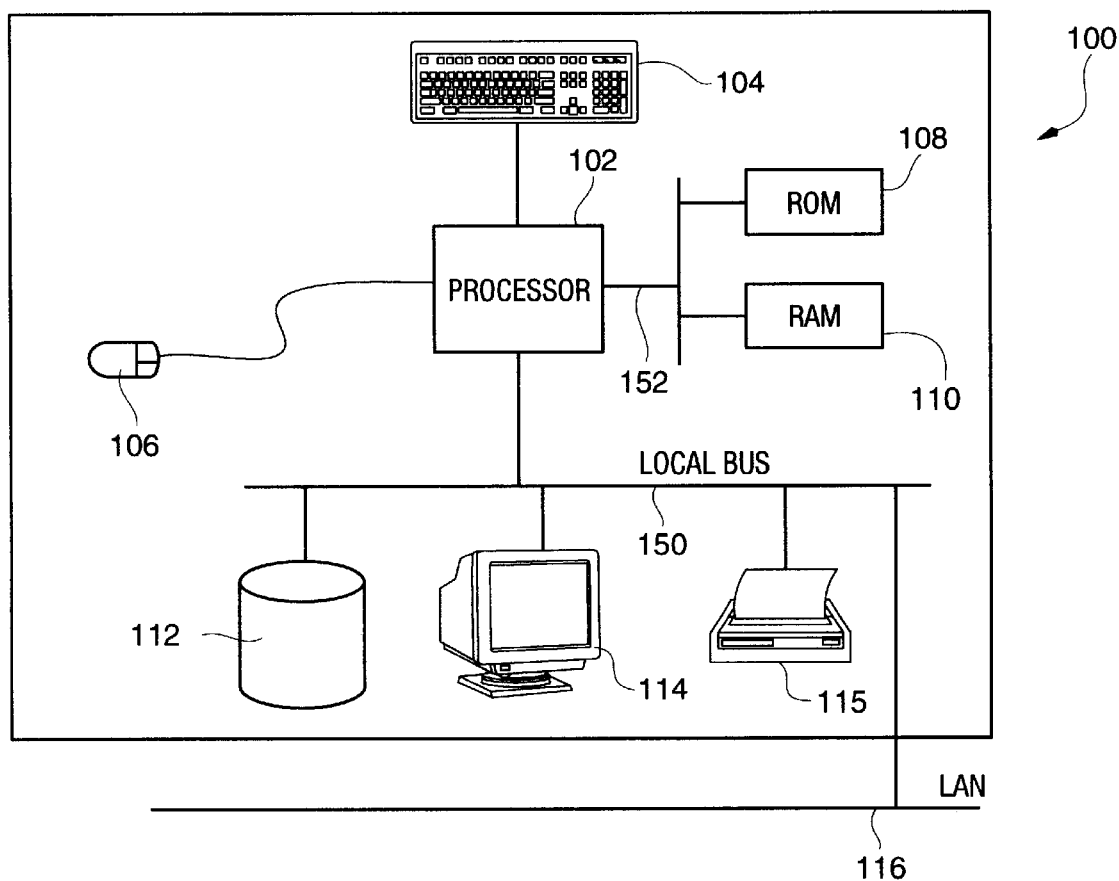
FIG. 1 illustrates a computing environment in block diagram form for generating a simulation monitor and executing the simulation monitor with a logic simulation.

Simulation Monitoring System Computing Environment—FIG. 1

FIG. 1 illustrates an example of a computing system 100 in block diagram form for generating a simulation monitor and executing the simulation monitor with a logic simulation for the purpose of generating a test vector set. The test stimulus verification and vector extraction system of the present invention is operable in any of several standard computing systems readily available in the industry such as computer system 100. The programmed instructions and/or commands for generating and executing the simulation monitor, in addition to the logic simulator itself, are executable on processor 102. Processor 102 stores and/or retrieves programmed instructions and/or data from volatile or non-volatile memory devices that include, but are not limited to, Random Access Memory (RAM) 110 and Read Only Memory (ROM) 108 by way of memory bus 152. Another accessible memory device includes non-volatile memory device 112 by way of local bus 150. User input to computer system 100 is entered by way of keyboard 104 and/or pointing device 106. Human readable output from computer system 100 is viewed on display 114 or in printed form on local printer 115. Alternatively, computer system 100 is accessible by remote users transfer files, remotely execute any of the simulation monitoring system processes, or the logic simulator itself on other computer systems in a network by way of network link 116. Other uses of network link 116 include, but are not limited to, accessing shared devices for generating human readable displays in printed, display screen output form or any other output form desired.

Figure 2:
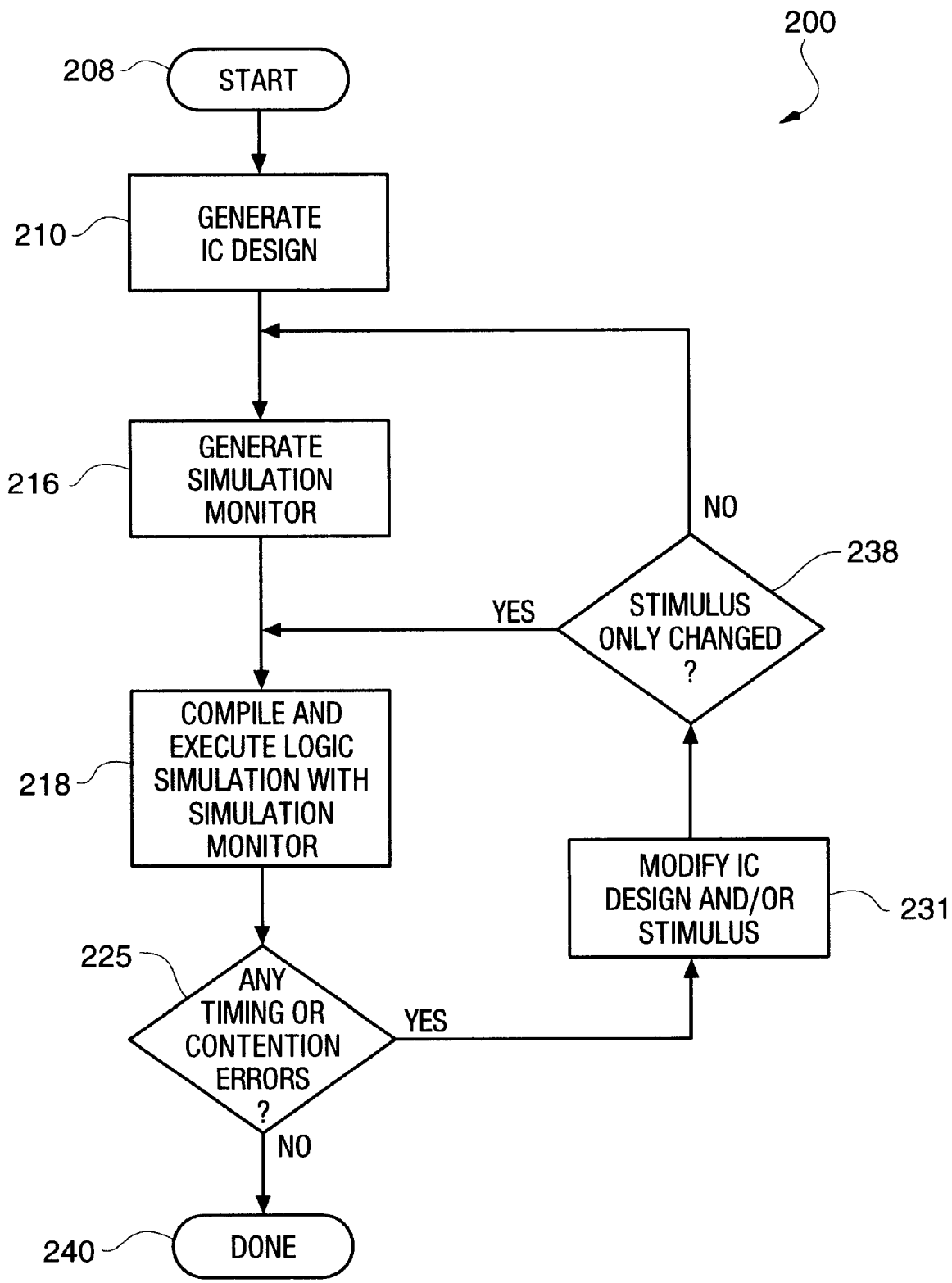
FIG. 2 illustrates an overview of the operational steps for the integrated circuit simulation monitoring system, in flow diagram form.

Operational Overview—FIG. 2

FIG. 2 illustrates an overview of the operational steps 200 for the integrated circuit simulation monitoring system, in flow diagram form. The operational steps 200 begin at step 208 and proceed to the step of generating an integrated circuit design at step 210. Given an integrated circuit design, an integrated circuit stimulation monitor is generated at step 216. Details of generating a simulation monitor are disclosed in the text accompanying FIGS. 3–5.

At step 218, the simulation monitor is compiled and executed on a processor 102 as part of the logic simulation itself. Details of compiling and executing a simulation monitor with the logic simulation are disclosed in the text accompanying FIGS. 6–8. If, upon reviewing the output of the simulation monitor at decision step 225, it is determined that a timing error and/or contention error occurred during the simulation, the integrated circuit design and/or the input stimulus set to the logic simulation are modified at step 231 to eliminate the error. If it is determined at decision step 238 that only the stimulus was changed, then processing continues at step 218 as previously disclosed. However, if it is determined at decision step 238 that the integrated circuit design itself required changing, then processing continues at step 216 because the integrated circuit parameter file will also require changing.

Determining what to modify and how to modify either the integrated circuit design, and/or input stimulus set so that they run error free, remains a manual task of the integrated circuit designer. However, key to aiding the integrated circuit designer in debugging a logic simulation error when the logic simulation was run with the simulation monitor, is that the simulation monitor error output contains information specific to the circumstances of a specific error, the type of error that occurred, and the pin on which the error was detected. Logic errors are separately detected and reported for debugging purposes in a manner consistent with the logic simulation design. The simulation monitor does not detect logic errors, and its execution and output file are transparent to the logic simulation.

The debugging process for both the integrated circuit design and the test stimulus set proceed concurrently for as many logic simulation runs as are necessary through step 218 to debug both the integrated circuit design and the test stimulus set. If at decision step 225 the simulation monitor output indicates that the integrated circuit design is free of logic errors, then logic simulation phase of the integrated circuit design is complete at step 240 and a test vector set exists that is ready for use on the ATE. The resulting test vector set includes input stimulus and expected responses that have been captured or extracted during the logic simulation.

Figure 3:
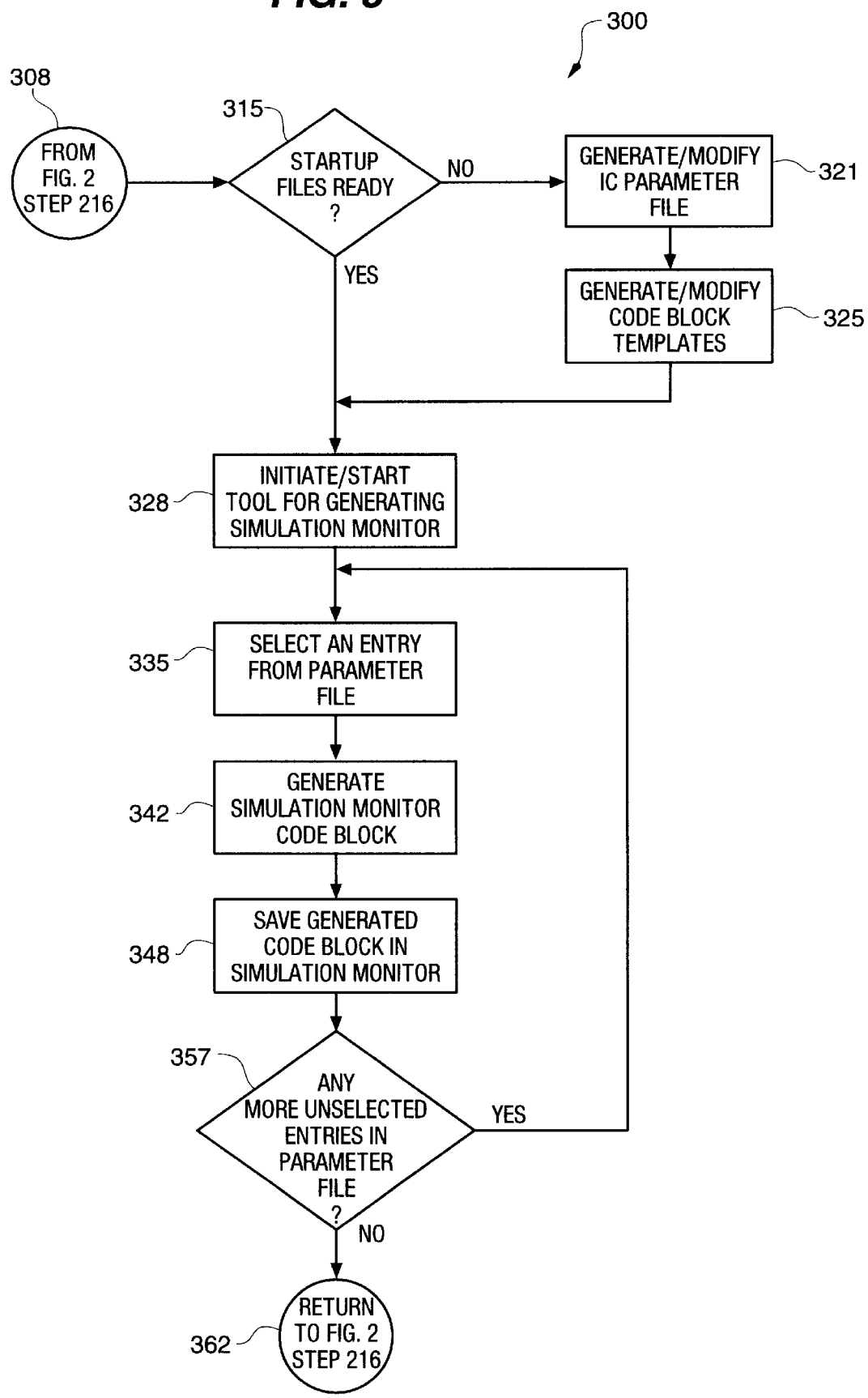
FIG. 3 illustrates the details of generating the simulation monitor, in flow diagram form.

Generating a Simulation Monitor—FIGS. 3–5

FIGS. 3–5 illustrate the details of generating a simulation monitor. Specifically, FIG. 3 illustrates the operational steps 300 in flow diagram form for generating a simulation monitor. Operational steps 300 are the details of step 216 from FIG. 2. FIG. 4 illustrates an example of an integrated circuit parameter file 400 in input file form. FIG. 5 illustrates an example of a code block template 510 and a simulation monitor code block 550 in programming language code form.

In FIG. 3, the operational steps 300 begin at step 308 and proceed to decision step 315. If at decision step 315 it is determined that simulation monitor generating startup files or an integrated circuit parameter file does not exist or requires updating, then processing continues at step 321 where an integrated circuit parameter file is generated. An integrated circuit parameter file is a summary of information including, but not limited to, a pin by pin definition of each input and each output signal and the timing parameters and other information relevant to each type signal. An example of an integrated circuit parameter file and the type of information contained in the file is illustrated in FIG. 4.

Once an integrated circuit parameter file is generated at step 321, processing continues at step 325. Note that there is no dependency on the order of occurrence of steps 321 and 325. The order of occurrence of steps 321 and 325 is interchangeable and/or the steps can occur substantially concurrently. At step 325, a code block template is defined for each distinct signal format type specified in the integrated circuit parameter file. Functionally, a code block template is a complete set of programming language statements that contain substitutable parameter place holders in key locations throughout the programming language statements. The substitutable parameter place holders exist so that different values from the integrated circuit parameter file can be filled in when generating a simulation monitor code block for the simulation monitor. Substantively, a code block template contains the programming instructions necessary to perform ATE compatibility checks, output strobe margin checks, and automatic contention checks as appropriate for the various pins in the integrated circuit design. The specific details of each code block template are a function of the signal type for each pin in the integrated circuit. The specific signal types are disclosed in the text accompanying FIG. 5 although FIG. 5 itself illustrates only one sample of code for one signal type. The specific details of each parameter value in the integrated circuit parameter file are disclosed in the text accompanying FIG. 4. Once all necessary code block templates are defined at step 325, processing continues at step 328.

If at decision step 315 it is determined that an acceptable integrated circuit parameter file 400 and the necessary code block templates already exist for the immediate integrated circuit design, then processing continues directly to step 328 without generating or modifying the integrated circuit parameter file and/or the code block templates. At step 328, the simulation monitor generating tool is started and initialization begins in preparation to interpret each entry in the integrated circuit parameter file and generate the simulation monitor as a series of simulation monitor code blocks. Initialization includes, but is not limited to, loading and/or starting a simulation monitor generating tool so that the simulation monitor generating tool can proceed to load and/or open the integrated circuit parameter file, and load and/or open the file or files containing the individual code block templates. When initialization is complete processing continues at step 335. At step 335, an entry is selected from the integrated circuit parameter file. Integrated circuit parameter file entries can be selected in any order.

At step 342, the selected integrated circuit parameter file entry is parsed into its individual fields. A code block template is selected that corresponds to the format type identified in the selected entry. A simulation monitor code block is constructed by substituting the various values from the parsed parameter file entry into the substitution fields of the appropriate code block template.

At step 348, the generated simulation monitor code block is permanently saved as one of a plurality of code blocks that collectively comprise the overall simulation monitor. If at decision step 357 it is determined that there are additional unselected entries in the integrated circuit parameter file, then processing continues at step 335 as previously disclosed. If at decision step 357 it is determined that all entries in the integrated circuit parameter file have been selected and integrated into simulation monitor code blocks, then the simulation monitor generating steps are complete at step 362.

FIGS. 4A and 4B illustrate an example of an integrated circuit parameter file 400. The integrated circuit parameter file 400 illustrated in FIGS. 4A and 4B contains a device header 410 and a pin specification section 420. The device header 410 contains general device information in header entries 411–417. Header entries 411–417 for example can include, but are not limited to or expressly required to include information relating to, a device type 411, a device part number 412, a device version number 413, a simulation instance name 414, a device pin count 415, a simulation period size 416, and an output strobe margin 417. In a preferred embodiment, all of the header entry information is made conveniently available in the device header 410 itself. Although all of the header entry information is useful for generating the simulation monitor, the output strobe margin 417 and the simulation period size 416 are the essential entries because they provide information used globally throughout the simulation monitor to insure that an ATE compatible test stimulus set is being debugged. The remaining information in header entries 411–415 can be supplied by other means, including but not limited to, by way of an interactive or command line parameter input. The device pin count 415 could also be determined by inspecting the pin list in the pin specification section 420.

The pin specification section 420 includes a plurality of rows 450 including at least one row for each pin totaled in the Pin Count 415 header entry. Each of the plurality of rows 450 is subdivided by at least one of a plurality of columns identified by column headers 430 that include individual columns 431–443. One column that is common to each of the plurality of rows 450 is the Pin Number column 431. Pin Number column 431 identifies each pin or other signal lead that would correspond to a physical pin or other signal lead in a production version of the integrated circuit design being simulated.

Signal Name column 432 identifies the user defined name of the signal associated with each given pin in the integrated circuit design being simulated. Signal names are typically unique, however, certain conventional names are used including, but not limited to, No Connect (NC) 451–453 for a dummy pin that is not part of the integrated circuit, VSS 456 for a pin that carries voltage to ground, and VDD 458 for a pin that carries power to the integrated circuit.

Pin Type column 433 identifies the basic signal type for each pin in the integrated circuit design. Pin types include, but are not limited to, INPUT, OUTPUT, INput OUTput (INOUT), POWER, GROUND, and No Connect (NC). An INPUT pin is one that carries input only to the integrated circuit, An OUTPUT pin is one that carries output only from the integrated circuit. An INOUT pin is one that carries both input and output to and from the integrated circuit, also referred to as a bidirectional pin. A GROUND pin is one that carries voltage from the integrated circuit to ground. A POWER pin is one that carries voltage from a voltage source to the integrated circuit. An NC pin is one that is not present in use in the integrated circuit for any purpose. The pin types POWER, GROUND, and NC do not have any parameters in the integrated circuit parameter file other than a pin number and signal name. Pin types INPUT, OUTPUT, and INOUT have a variety of parameters as specified in Table 1 below:

TABLE 1

<pin><name> INPUT <cell><fmt><i1><i2>[pull][str[
<pin><name> OUTPUT <cell><o1><o2><otype><oe>[pull][str]
<pin><name> INOUT <cell><fmt><i1><i2><o1><o2><otype>
    <allow cont><ie><oe>[pull][str]

Each of the above fields are defined in Table 2 below and correspond to a column in the integrated circuit parameter file. Note that parameters in <angle brackets> are required and parameters in [square brackets] are optional.

TABLE 2

| | |
|---|---|
| pin | pin number |
| name | signal name |
| cell | pad cell type |
| fmt | input signal format type (NRZ/RZ/RO/SBC) |
| i1 | input start time |
| i2 | input stop time |
| o1 | output start time |
| o2 | output stop time |
| otype | output driver type (S3/OD/OS/PP) |
| allow cont | allow contention (TRUE/FALSE) |
| ie | input enable signal |
| oe | output enable signal |
| pull | external pull-up/down (PU/PD) |
| str | external pull strength (in $\mu A$) |

Cell Type column 434 is informational only and describes the physical pad cell type that is used for the INPUT, OUTPUT, and INOUT type signals only.

Format column 435 is important to generating a simulation monitor because the format of a signal's behavior for a given pin is used by the simulation monitor to determine if the logic activity carried on by the logic simulator is within acceptable parameters. The acceptable parameters are defined for each format type in the remaining columns 436–443. Examples of the signal formats present in the integrated circuit parameter file 400 include Surround By Complement (SBC) 454, Non-Return to Zero (NRZ) 455, and Return to One (RO) 457. Other signal formats that are not present in the integrated circuit parameter file 400 example include, but are not limited to, Return to Zero (RZ). The profiles of each of the above identified signal formats are well known in the digital electronics and integrated circuit arts. Note that any signal format can be specified in Format column 435 provided there is a corresponding code block template defined in step 325 as disclosed below. One object of the programming language instructions within a code block template is to provide the tests for monitoring a given type of signal format. For example, the code block template for an RO signal type includes the appropriate tests to determine that the signal has returned to one and that the signal returned to one at the appropriate time. The general categories of test that are coded into code block template are disclosed in the text accompanying FIG. 5.

Input and output timing parameters 436–439 contain information for both input stimulus and response analysis "strobes" that will be used on the ATE. The input start and stop timing parameters 436–437 describe the relative edge placement information which will be used along with the format 435 to program the ATE to generate the stimulus for that signal. With this information, the simulation monitor will be able to discern whether the stimulus waveforms are compatible with those that the ATE can generate. The output start and stop timing parameters 438–439 describe the relative timing of the output signal strobes that will be used by the ATE to examine the response information generated by the circuit. During the "active" period of the strobe, the ATE will perform a comparison with the actual circuit response and the expected response found in the test vectors that are captured during simulation by the simulation monitor.

The output driver type column 440 is required for each output and input signal and is used to describe the type of logic states that may be generated by the device under test. An "S3" driver type is a tri-state driver capable of driving logic 1, logic 0, and high impedance states. An "OD" driver type is an open drain driver capable of driving logic 0 and high impedance states only. An "OS" driver type is an open source driver capable of driving logic 1 and high impedance states only. A "PP" driver type is a push-pull driver capable of driving logic 1 and logic 0 states only. Generally, the driver type information is used to generate some of the output signal checking rules embodied within the simulation monitor.

The Allow Contention column 441 indicates whether contention is allowed or disallowed for pins having a Pin Type 433 of INOUT, and determines whether a contention type is treated as an error or a warning. Contention exists when an input stimulus signal and an integrated circuit originating output signal are driving the same Pin 431 at the same time. The types of contention detected by the simulation monitor include, but are not limited to, same-level contention and different-level contention. Same-level contention exists when both an input stimulus and an integrated circuit originating output signal are driving the same logic level on the same Pin 431 at the same time. Same-level contention is treated as a warning if the Allow Contention 441 is set to TRUE. However, same-level contention is disallowed for a specific pin and is treated as an error if the Allow Contention 441 is set to FALSE. If neither TRUE nor FALSE are specified for bidirectional Pin Type 433 of INOUT, the simulation monitor can treat same-level contentions as an error or warning by a default setting. Different-level contention exists when both an input stimulus and an integrated circuit originating output signal are driving different logic levels on the same Pin 431 at the same time. Different-level contention is always treated as an error because opposing logic levels on the same pin at the same time are not interpretable.

Input Enable column 442 and Output Enable column 443 enable contention checks and extraction capabilities for the simulation monitor. The Input Enable 442 is required for all Pin Type 433 INOUT signals to determine when an input stimulus is driving an INOUT type pin. The Output Enable 443 is required for all Pin Type 433 INOUT signals to determine when the integrated circuit is driving an output signal on an INOUT type pin. Output Enable 443 is also required for all Pin Type 433 OUTPUT signals, to determine when the integrated circuit is driving an output signal.

Additional fields in the integrated circuit parameter file 400 can include, but are not limited to, an External Pull-up/down Presence field and an External Pull-up/down Strength Field as indicated on row 459 entries 460–461 respectively. The External Pull-up/down Presence FIELD 460 and External Pull-up/down Strength Field 461 are not used by the simulation monitor during a logic simulation, however, the information can be specified in the integrated circuit parameter file 400 for later use by the ATE during setup to establish a test environment. The External Pull-up/down Presence FIELD 460 is required for each INPUT, OUTPUT, or INOUT Pin Type 433 that requires an external pull-up (PU) or pull-down (PD) resistor during ATE testing. The External Pull-up/down Strength FIELD 461 is required for each INPUT, OUTPUT, or INOUT Pin Type 433 that requires an external pull-up/down, and indicates the strength in microamps of the external pull-up (PU) or pull-down (PD) resistor that is required during ATE testing.

FIG. 5 illustrates an example of a code block template 510 and a corresponding simulation monitor code block 550 in programming language form for an NRZ input stimulus check. There are many other types that are not illustrated here in this same detail but have a similar overall structure of variable substitutions. Code block template 510 is a template for a Non-Return to Zero (NRZ) type signal format. For example using entry 455 as an example of a selected entry from the integrated circuit parameter file 400, the Format 435 column identifies entry 455 as a NRZ format so that the corresponding NRZ code block template 510 would be selected as the desired template. The code block template 510 example is written in Verilog from Cadence Design Systems, Inc., and is only one example of several logic simulation programming languages that are commercially available in the industry. The important aspect of code block template 510 regardless of the logic simulation programming language used, is that the template contains substitutable parameter place holders 511–520 that correspond to information in columns 430 of FIG. 4. Thus, the code block template such as the code block template 510 for an NRZ signal format, can generate substantially similar simulation monitor code blocks for each pin having a similar format type. The remaining fields in code block template 510 contain global variable information that are defined by either the user or the logic simulation libraries as dictated by the logic simulation tool for which the simulation monitor is being generated.

The specific implementation of any one test in a code block template are user defined in view of the type of signal involved, the flexibility of the logic simulator programming language, and the programming libraries and definitions available for use by the simulation monitor code blocks. The categories of tests that are built into any given code block template include, but are not limited to, ATE compatibility checks, output strobe margin checks, and contention checks. ATE compatibility checks include, but are not limited to, verifying that input timings are operating within expected limits, output timings are operating within expected limits, external pull strengths are operating within ATE tester limits, the input stimulus matches what is specified in the integrated circuit parameter list file, and the manufacturing verification tests match the logic simulation activity. Output strobe margin checks include, but are not limited to, verifying that the output signals are stable throughout the strobe window, verifying that the output signal does not change too close to the strobe window, verifying that the strobe margins are not violated so that strobing is prevented, and generating a debugging message to assist the user in identifying the problems so that the design and/or strobe placements can be changed to allow additional strobing. Contention checks on bidirectional INOUT pins include, but are not limited to, verifying that acceptable separation exists between input signals and output signals, distinguishing between same-level and different-level contentions, and distinguishing between an error and a warning for same-level contentions. Messages are generated for each of the above categories of tests to assist the user in identifying and correcting these errors.

Simulation monitor code block 550 is an example of a code block template such as the NRZ code block template 510 that contains the specific data for Pin Number 13 from column 431 of FIG. 4. Specifically, the pin number value "13" is extracted from Pin Number column 431 row 455 of the parameter file 400, and placed in the PIN NUM fields 518 and 520 of code block template 510 to generate entries 558 and 560 of simulation monitor code block 550. Similarly, the signal name string "tb.ul.D0" is extracted from Signal Name column 432 row 455 of the parameter file 400, and placed in the SIGNAL NAME fields 511, 515–517, and 519 of code block template 510 to generate entries 551, 555–557, and 559 of simulation monitor code block 550. This substitution process continues for each substitutable parameter place holder 511–520 to generate a unique simulation monitor code block such as simulation monitor code block 550 containing entries 551–560.

When all parameter information for all pins in rows 450 of the parameter file 400 are substituted into the respective code block templates, a complete set of programming language statements for a simulation monitor exists.

Figure 6:
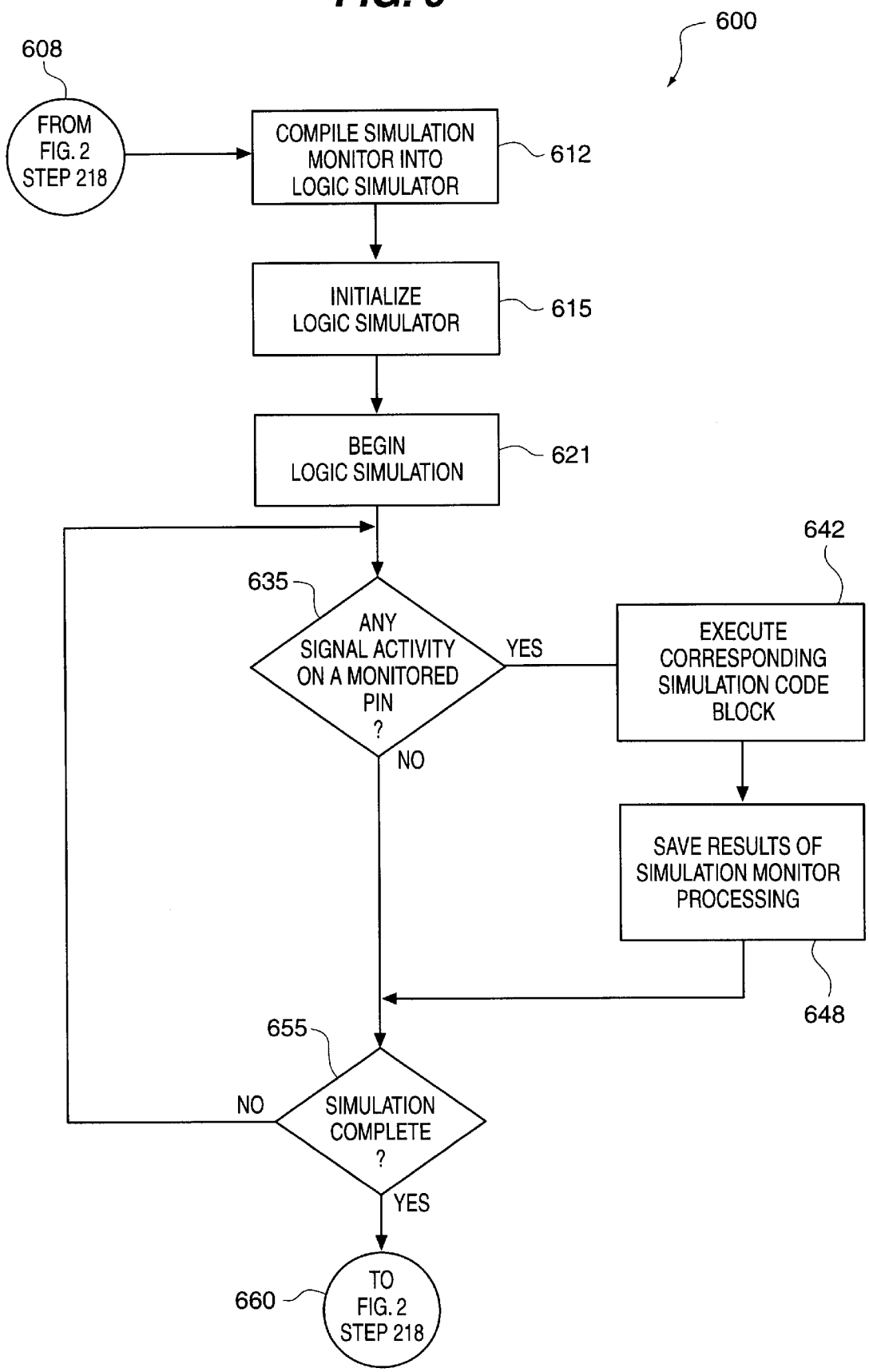
FIG. 6 illustrates the details of executing the simulation monitor, in flow diagram form.
Figure 8:
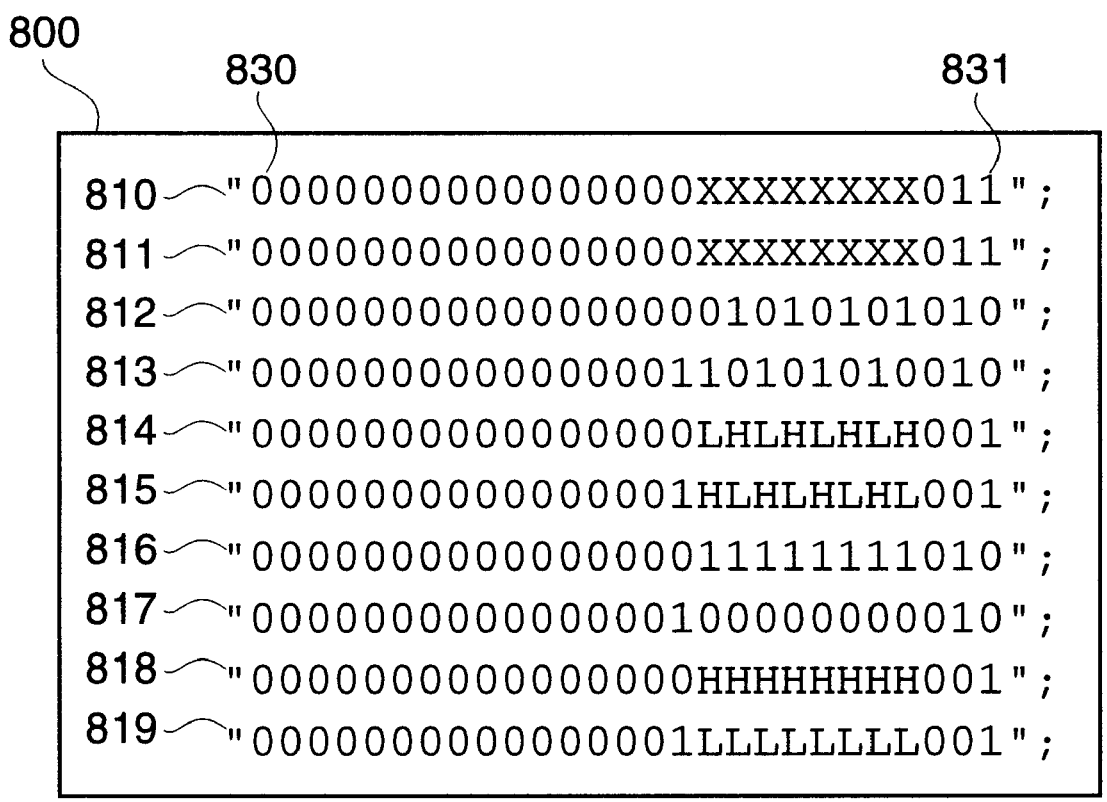
FIG. 8 illustrates an example of a test vector file.

Logic Simulation Monitoring—FIGS. 6–8

FIGS. 6–8 illustrate the details of executing a logic simulation with a simulation monitor. Specifically, FIG. 6 illustrates the details of step 218 from FIG. 2 which are the operational steps 600 for running the simulation monitor. FIG. 7 illustrates an example of the output generated by the simulation monitor. FIG. 8 illustrates an example of a test vector file resulting from an error free execution of the simulation monitor.

In FIG. 6, the operational steps 600 begin at step 608 and proceed to compile the logic simulator programming language steps and the simulation monitor into a single machine executable binary object module at step 612. It is important to note that in the preferred embodiment, when the simulation monitor is compiled with the logic simulator, the simulation monitor code becomes an integral part of the logic simulation so that executing the logic simulation executes the simulation monitor without any additional requirements. Alternative embodiments for preparing an executable logic simulator and a simulation monitor include, but are not limited to, compiling a simulation monitor that is an independent executable object separate from the logic simulator. This alternative embodiment allows the simulation monitor to monitor the logic simulation as an independent object by way of standard method calls and interprocess communications that are known in the object oriented programming field, so that the simulation monitor can monitor each input signal and output signal processed by the logic simulation process.

At step 615, the logic simulation is started and initialized. Initialization includes, but is not limited to, loading and initializing the compiled logic simulator. Loading a machine executable binary object module from either a volatile memory or a non-volatile persistent memory, into a processor's volatile operational memory, is accomplished in a manner common in the computing industry. Initializing the logic simulator includes, but is not limited to, locating and reading a file containing the stimulus that will be applied to the logic simulation, locating and reading a file containing the integrated circuit design on which the simulation is based, and creating any sub-processes that are required that simulate the various integrated circuit components designed to input, output, and/or respond to applied stimuli in a manner consistent with the integrated circuit design on which the simulation is based.

The logic simulation begins at step 621. Beginning the logic simulation includes applying the stimulus to the appropriate simulated pins of the simulated integrated circuit. Monitoring the logic simulation begins at decision step 635 at a time substantially concurrent with step 621. The purpose of the simulation monitor process is to monitor and record activity of the logic simulator process in real time for every input and/or output action taking place as part of the simulation of the integrated circuit, and generate a test vector set at the completion of a successful simulation that is in a format that is ready to compile and run on an ATE.

If at decision step 635 it is determined that an input stimulus is applied to a simulated input pin on the logic simulator, then processing proceeds to step 642. At step 642, the simulation monitor code block corresponding to the pin that is active due to the applied stimulus, is executed to monitor the timing of signal changes and/or input and output contentions as specified in the specific simulation monitor control block. For example, if an input stimulus is applied to simulated pin 13, then the simulation monitor code block 550 illustrated in FIG. 5 would execute and print an error message if a contention exists or an input stimulus timing error occurred. An input timing error might include the failure for a signal to conform to the NRZ, SBC, or RO in either format as specified in the code block. At step 648, the results of extracting stimulus results and executing the appropriate simulation monitor code block, are saved in respective output files and processing continues at decision step 655. If at decision step 635 there was no stimulus activity to monitor, then processing continues directly to decision step 655.

If at decision step 655 it is determined that the logic simulation is not complete, then processing continues to wait for signal activity due to an applied stimulus at decision step 635. Alternatively, if at decision step 655 it is determined that the logic simulation is complete, then simulation processing and simulation monitor processing stops at step 660.

FIG. 7 illustrates the results of the simulation monitoring in the monitoring output file 700. If the simulation monitor fails to detect any test stimulus set errors then no error statements appear in the simulation monitor error output file and the resulting test vector set that includes the stimulus input of the logic simulation's test stimulus set and the responses to the input stimulus. The test vector set is ready for compilation and use on the ATE. However, if the simulation monitor detects an error relating to one of the stimuli of the test stimulus set, then an error statement is generated in a file substantially similar to simulation monitor output file 700. Error statements 710, 730, and 750 in simulation output file 700 relate to input stimulus timing errors for the respective signals identified at the end of each error statement. Error statements 720 and 740 in simulation output file 700 relate to contention errors for the respective signals identified at the end of each error statement. By reviewing the simulation monitor output file 700 the observer can identify a specific errant signal and the type of error involved. The analysis of the type of signal in error and what error is involved is completed in real time during the logic simulation by executing the respective simulation monitor code blocks at the time the respective input signals were active.

FIG. 8 illustrates a test vector set 800 generated from a clean run of the simulation monitor. The test vector set 800 contains rows 810–819 where each row represents one vector or clock cycle. Each column 830 through 831 represents activity on a pin of the integrated circuit. Each character in the test vector set 800 has a specific input or output meaning as set out in Table 3 below. Note that the inputs and outputs are specified from the perspective of the Device Under Test (DUT) and signal ordering for the test vector set 800 can be specified either in the test vector set 800 or in a separate file. In a preferred embodiment the signal ordering is separate from the test vector set 800.

TABLE 3

O = drive (input) logic 0
I = drive (input) logic 1
L = strobe (output) logic 0
H = strobe (output) logic 1
X = neither drive nor strobe (don't care)

SUMMARY

The integrated circuit test stimulus verification and vector extraction system generates a simulation monitor comprising at least one simulation monitor code block from the combined input of an integrated circuit parameter file and a code block template. The simulation monitor can be executed unobtrusively by compiling the respective simulation monitor code blocks into the logic simulator so that the simulation monitor code blocks execute when the respective input and output signals are active. Output from the simulation monitor includes an error log that assists the user in quickly locating and correcting errors in the test stimulus set intended for use with an ATE during manufacturing tests, and a complete test vector set that contains the test stimulus set input as well as stimulus responses extracted during the logic simulation, all in a format that is compatible with the ATE. Although specific embodiments are disclosed herein, it is expected that persons skilled in the art can and will design alternative integrated circuit simulation monitor systems that are within the scope of the following claims either literally or under the Doctrine of Equivalents.

What is claimed is:

1. A method that generates a set of ATE test set vectors for use in in generating a program to test an integrated circuit with an Automated Testing Device, said method comprising the steps of:

receiving a specification of said integrated circuit which includes signal timing information of said integrated circuit and definitions of each pin of said integrated circuit;

receiving a set of user defined test vectors for said integrated circuit wherein said test vectors represent signals applied to pins of said integrated circuit;

generating a simulation monitor from said specification of said integrated circuit wherein said simulation monitor includes instructions for executing tests on said integrated circuit by:
1.) reading a pin definition from said integrated circuit specification,
2.) generating a simulation monitor code block for said pin definition by:
  a.) parsing said pin definition into a plurality of entries in said definition wherein each entry is an attribute of signals over said pin;
  b.) reading a one of said plurality of entries identifying a pin type:
  c.) selecting a one of a plurality of block code templates based upon pin type; and
  d.) substituting values from said parsed entries into said one of said plurality of code block templates to complete said simulation monitor code block for said pin,
3.) saving said simulation monitor code block for said pin definition in said simulation monitor,
4.) determining whether said integrated circuit specification contains a pin definition that has not been read, and 5.) repeating steps 1–4 responsive to a determination that said integrated circuit specification contains a pin definition that has not been read;

compiling said simulation monitor into a logic simulation of said integrated circuit responsive to a generation of said simulation monitor;

generating a set of ATE test vectors for said integrated circuit by executing said logic simulation on said set of user defined test vectors; and storing said set of ATE test vectors responsive to said logic simulation generating said set of result vectors.

2. The method of claim 1 further comprising the steps of:

detecting an error generated during execution of said logic simulation;

generating an error message responsive to detecting said error; and writing said error message in a logic simulation error output file.

3. A product for directing a computer to generate a set of ATE test vectors for a logic simulation of an integrated circuit for use in testing said integrated circuit using an ATE, said product comprising:

instructions for:

reading an integrated circuit file storing a specification of said integrated circuit which includes signal timing information of said integrated circuit and a definition of each pin in said integrated circuit, receiving a set of user defined test vectors for said integrated circuit wherein said user defined test vectors represent signals applied to pins of said integrated circuit, generating a simulation monitor from said specification of said integrated circuit wherein said simulation monitor includes instructions for executing tests on a pin of said integrated circuit by:

1.) reading a pin definition from said integrated circuit specification;

2.) generating a simulation monitor code block for said pin definition by:

a.) parsing said pin definition into a plurality of entries in said definition wherein each entry is an attribute of signals over said pin, b.) reading a one of said plurality of entries identifying a pin type, c.) selecting a one of a plurality of block code templates based upon pin type, and d.) substituting values from said parsed entries into said one of said plurality of code block templates to complete said simulation monitor code block for said pin;

3.) saving said simulation monitor code block for said pin definition in said simulation monitor;

4.) determining whether said integrated circuit specification contains a pin definition that has not been read; and 5.) repeating instructions 1–4 responsive to a determination that said integrated circuit specification contains a pin definition that has not been read, compiling said simulation monitor into a logic simulation of said integrated circuit responsive to a generation of said simulation monitor, generating a set of ATE test vectors for said integrated circuit by executing said logic simulation on said set of user defined test vectors, and storing said set of ATE test vectors responsive to said logic simulation generating said set of result vectors, and a computer readable media for storing said instructions.

4. The product of claim 3 wherein said instructions further comprise:

instructions for detecting errors generated during execution of said logic simulation, for generating an error message, and for writing said error message in a logic simulation error output file.

* * * * *